(12) United States Patent
Li et al.

(10) Patent No.: US 12,369,432 B2
(45) Date of Patent: Jul. 22, 2025

(54) LED EPITAXIAL STRUCTURE AND PREPARATION METHOD AND APPLICATION THEREOF

(71) Applicant: FOCUS LIGHTINGS TECH CO., LTD., Jiangsu (CN)

(72) Inventors: Guochang Li, Jiangsu (CN); Zhijun Xu, Jiangsu (CN); Han Jiang, Jiangsu (CN); Hu Cheng, Jiangsu (CN); Yangyang Xu, Jiangsu (CN); Wenjun Wang, Jiangsu (CN); Shuwei Yuan, Jiangsu (CN)

(73) Assignee: FOCUS LIGHTINGS TECH CO., LTD., Suzhou (CN)

( * ) Notice: Subject to any disclaimer, the term of this patent is extended or adjusted under 35 U.S.C. 154(b) by 0 days.

(21) Appl. No.: 17/790,829

(22) PCT Filed: Feb. 16, 2022

(86) PCT No.: PCT/CN2022/076489
§ 371 (c)(1),
(2) Date: Jul. 5, 2022

(87) PCT Pub. No.: WO2023/108882
PCT Pub. Date: Jun. 22, 2023

(65) Prior Publication Data
US 2024/0170606 A1  May 23, 2024

(30) Foreign Application Priority Data
Dec. 13, 2021 (CN) .......................... 202111520260.8

(51) Int. Cl.
*H10H 20/812* (2025.01)
*H01L 25/075* (2006.01)
(Continued)

(52) U.S. Cl.
CPC ....... *H10H 20/812* (2025.01); *H01L 25/0753* (2013.01); *H10H 20/01335* (2025.01);
(Continued)

(58) Field of Classification Search
CPC ....... H01L 33/06; H01L 33/007; H01L 33/12; H01L 33/145; H01L 33/325
See application file for complete search history.

(56) References Cited

U.S. PATENT DOCUMENTS

| | | | |
|---|---|---|---|
| 2009/0152529 A1* | 6/2009 | Chua | B82Y 20/00 438/45 |
| 2017/0110852 A1 | 4/2017 | Mino et al. | |
| 2021/0343897 A1 | 11/2021 | Chang et al. | |

FOREIGN PATENT DOCUMENTS

| | | |
|---|---|---|
| CN | 102104095 A | 6/2011 |
| CN | 103022288 A | 4/2013 |

(Continued)

*Primary Examiner* — Jay C Kim
*Assistant Examiner* — Woo K Lee
(74) *Attorney, Agent, or Firm* — Daniel M. Cohn (57) ABSTRACT

The present application relates to an LED epitaxial structure and the preparation method and application thereof. The LED epitaxial structure comprises a first multiple-quantum-well light-emitting layer and a second multiple-quantum-well light-emitting layer. The first multiple-quantum-well light-emitting layer comprises a first shoes layer, a first well layer, a first cap layer, and a first Barrier layer epitaxially grown from bottom to top in sequence. The second multiple-quantum-well light-emitting layer comprises a second shoes layer, a second well layer, a second cap layer, and a second Barrier layer epitaxially grown from bottom to top in sequence. The technical solutions disclosed in the present application can solve the problem that the 365 nm to 375 nm wave band LED would emit yellow light.

9 Claims, 3 Drawing Sheets

(51) Int. Cl.
*H10H 20/01* (2025.01)
*H10H 20/815* (2025.01)
*H10H 20/816* (2025.01)
*H10H 20/825* (2025.01)

(52) U.S. Cl.
CPC ...... *H10H 20/815* (2025.01); *H10H 20/8162* (2025.01); *H10H 20/8252* (2025.01)

(56) References Cited

FOREIGN PATENT DOCUMENTS

| | | |
|---|---|---|
| CN | 107946420 A | 4/2018 |
| CN | 108899398 A | 11/2018 |
| CN | 111769181 A | 10/2020 |
| CN | 111834500 A | 10/2020 |
| CN | 112531081 A | 3/2021 |
| KR | 20140013249 A | 2/2014 |

* cited by examiner

First multiple-quantum-well light-emitting layer

| | Thickness | SI doping | Al component (%) | In Component (%) | Temperature |
|---|---|---|---|---|---|
| First Barrier layer | 50~150Å | 1e17~1e18 | 10~20 | | 850~950 |
| First cap layer | 5~20Å | | | | 800~900 |
| First well layer | 25~40Å | | | 0~3 | 800~900 |
| First shoes layer | 5~20Å | | | | 800~900 |

Fig. 1

Second multiple-quantum-well light-emitting layer

| | Thickness | SI doping | Al Component (%) | In Component (%) | Temperature |
|---|---|---|---|---|---|
| Second Barrier layer | 50~150Å | 1e17~1e18 | 10~20 | | 850~950 |
| Second cap layer | 5~20Å | | | | 800~900 |
| Second well layer | 25~40Å | | | 4~6 | 800~900 |
| Second shoes layer | 5~20Å | | | | 800~900 |

| | | Number of cycles | Thickness | Single-cycle thickness (ncycled) | Si doping | Mg doping | Al component (% In Comparison) | Al component (%) | Temperature |
|---|---|---|---|---|---|---|---|---|---|
| 15 | FP | | 10~50Å | | | 5E20~2E21 | | | 700~1000 |
| 14 | HP | | 100~500Å | | | 1e18~5e19 | | 10~20 | 900~1000 |
| 13 | p-AlGaN | | 100~500Å | | | 1e19~5e19 | | 20~40 | 900~1000 |
| 12 | AlN | | 10~20Å | | | | | | 850~950 |
| 11 | MQW-B | 1-21oop | 100~500Å | 100~180Å | 1e17~1e18 | | | 10~20 | 900~950 |
| 10 | MQW-A | 4-81oop | 500~1500Å | 100~180Å | 1e17~1e18 | | | 10~20 | 800~950 |
| 9 | n-AlGaN/n-GaN SL | 3~20loop | 50nm~200nm | 10~20nm | 1e17~1e18 | | | 10~20 | 850~950 |
| 8 | LD n-AlGaN | | 100~300nm | | 1e17~3e18 | | | 10~20 | 1050~1100 |
| 7 | n-GaN | | 1~2μm | | 1e19~3e19 | | | | 1050~1100 |
| 6 | GaN | | 50~150nm | | | | | | 1050~1100 |
| 5 | n-AlGaN/n-GaN SL | 20-80loop | 1~2μm | 10~30nm | 5e18~2e19 | | | 10~15 | 1050~1100 |
| 4 | n-AlGaN | | 200~400nm | | 1e18~1e19 | | | 20~40 | 900~1050 |
| 3 | n-GaN | | 1~2μm | | 1e18~1e19 | | | | 1050~1100 |
| 2 | n-GaN | | 2~3μm | | | | | | 1000~1100 |
| 1 | Sapphire Substrate | | | | | | | | |

Fig. 4

LED EPITAXIAL STRUCTURE AND PREPARATION METHOD AND APPLICATION THEREOF

CROSS-REFERENCE TO RELATED APPLICATION

The present application claims the priority to the Chinese patent application No. 202111520260.8, entitled "LED Epitaxial Structure and Preparation Method and Application thereof", filed on Dec. 13, 2021 with the China National Intellectual Property Administration, which is incorporated herein by reference in its entirety.

FIELD OF THE PRESENT DISCLOSURE

The present application relates to the field of LED (light-emitting diode) chip epitaxial growth, and particularly to an LED epitaxial structure and a preparation method and application thereof.

BACKGROUND OF THE PRESENT DISCLOSURE

The UVA wave band is a part of the ultraviolet wavelength division with the wavelength of 320~420 nm, the representative wavelength of which is 365 nm 370 nm and 380 nm~395 nm. The ultraviolet of each wave band is unique, for example, the wavelength of 365 nm for a mosquito eradication lamp. The application in this wave band cannot be replaced by other wave bands. LED in the UVA wave band is electroluminescent, which adopts the form of direct electro-optic conversion, with little energy conversion loss and, when in standby, almost zero power consumption. Therefore, the existing UVA LED has a great market prospect and commercial value.

In the prior art, when epitaxial growth is carried out in the epitaxial structure of the UVA LED, defects may be generated when gallium nitride in the epitaxial structure grows crystal. At the same time, deep-level light emission may be formed during the crystal growth process due to the admixture of impurities such as carbon and oxygen, namely, when using the LED with a wavelength of 365 nm, the LED light emission observed by the human eye is yellow light rather than purple light.

SUMMARY OF THE PRESENT DISCLOSURE

The present application provides an LED epitaxial structure capable of solving the problem that the 365 nm to 375 nm wave band LED would emit yellow light.

In a first aspect, the present application discloses an LED epitaxial structure comprising: a light-emitting layer, which comprises: a first multiple-quantum-well light-emitting layer and a second multiple-quantum-well light-emitting layer: wherein the second multiple-quantum-well light-emitting layer is arranged immediately adjacent to the first multiple-quantum-well light-emitting layer, or the second multiple-quantum-well light-emitting layer is arranged in the middle of the first multiple-quantum-well light-emitting layer; wherein the first multiple-quantum-well light-emitting layer comprises a first shoe layer, a first well layer, a first cap layer, and a first Barrier layer epitaxially grown from bottom to top in sequence; wherein a thickness of the first shoe layer is provided to be 5 angstroms to 20 angstroms; a thickness of the first well layer is provided to be 25 angstroms to 40 angstroms and an In component with respect to group III elements including In is provided to be 0% to 3%; a thickness of the first cap layer is provided to be 5 angstroms to 20 angstroms; a thickness of the first Barrier layer is provided to be 50 angstroms to 150 angstroms, a Si doping concentration is provided to be 1e17-1e18, and an Al component with respect to group III elements including Al is provided to be 10% to 20%; the second multiple-quantum-well light-emitting layer comprises a second shoe layer, a second well layer, a second cap layer, and a second Barrier layer epitaxially grown from bottom to top in sequence; wherein a thickness of the second shoe layer is provided to be 5 angstroms to 20 angstroms; a thickness of the second well layer is provided to be 25 angstroms to 40 angstroms and an In component with respect to group III elements including In is provided to be 4% to 6%; a thickness of the second cap layer is provided to be 5 angstroms to 20 angstroms; a thickness of the second Barrier layer is provided to be 50 angstroms to 150 angstroms, a Si doping concentration is provided to be 1e17 to 1e18, and an Al component with respect to group III elements including Al is provided to be 10% to 20%. With the technical solution shown in the present embodiment, and by making an appropriate composition ratio and an appropriate thickness setting of the light-emitting layer, the light emitted from the LED epitaxial structure using the light-emitting layer shown in the present application can be purple light rather than yellow light. At the same time, the voltage of the LED is reduced and the anti-aging performance is improved.

In some embodiments, the second multiple-quantum-well light-emitting layer is arranged immediately adjacent to an upper surface of the first multiple-quantum-well light-emitting layer, or the second multiple-quantum-well light-emitting layer is arranged immediately adjacent to a lower surface of the first multiple-quantum-well light-emitting layer. With the embodiments shown herein, more arrangements are provided for the light-emitting layer in a specific arrangement.

In some embodiments, the first multiple-quantum-well light-emitting layer has a thickness of 500 angstroms to 1500 angstroms, the Si doping concentration is 1e17 to 1e18, the Al component with respect to group III elements including Al is provided to 10% to 20%, and the In component with respect to group III elements including In is provided to be 0% to 3%; the thickness of the second multiple-quantum-well light-emitting layer is 100 angstroms to 500 angstroms, the Si doping concentration is 1e17 to 1e13, the Al component with respect to group III elements including Al is 10% to 20%, and the In component with respect to group III elements including In is 4% to 6%.

With the embodiments shown in the present application, it can be ensured that an LED structure under this component distribution ratio can emit purple light in the 365 nm~375 nm wave band.

In some embodiments, the LED epitaxial structure further comprises: a substrate layer, a u-GaN layer, an n-GaN layer, an n-type high-aluminium component AlGaN layer, an n-type AlGaN/GaN superlattice layer, an undoped GaN layer, an n-type high-doped AlGaN layer, an n-type low-doped AlGaN layer, a stress buffer layer, an electron blocking layer, a p-AlGaN layer, an HP layer, and a metal contact layer;

wherein the substrate layer, the u-GaN layer, the n-GaN layer, the n-type high-aluminium component AlGaN layer, the n-type AlGaN/GaN superlattice layer, the undoped GaN layer, the n-type high-doped AlGaN layer, the n-type low-doped AlGaN layer, the stress buffer layer, the light-emitting layer, the electron blocking layer, the p-AlGaN layer, the HP layer; and the metal contact layer forms the LED epitaxial structure which is successively and epitaxially grown from bottom to top starting from the substrate layer. With the embodiments shown in the present application, the suitability of the LED epitaxial structure can be ensured.

In some embodiments, the u-GaN layer has a thickness of 2 to 3 microns; the n-GaN layer has a thickness of 1 micron to 2 microns and a Si doping concentration of 1e18 to 1e19; the n-type high-aluminium component AlGaN layer has a thickness of 200 microns to 400 microns, a Si doping concentration of 1e18 to 1e19, and an Al component with respect to group III elements including Al of 20% to 40%; the n-type AlGaN/GaN superlattice layer has a thickness of 1 micron to 2 microns, a Si doping concentration of 5e18 to 1e19, and an Al component with respect to group III elements including Al of 10% to 15%; the undoped GaN layer has a thickness of 50 nm to 150 nm; the n-type high-doped AlGaN layer has a thickness of 1 micron to 2 microns, a Si doping concentration of 1e19 to 3e19, and an Al component with respect to group III elements including Al of 10% to 20%; the n-type low-doped AlGaN layer has a thickness of 100 nm to 300 nm, a Si doping concentration of 1e17 to 3e18, and an Al component with respect to group III elements including Al of 10% to 20%; the stress buffer layer has a thickness of 50 nm to 200 nm, a Si doping concentration of 1e17 to 1e18, and an Al component with respect to group III elements including Al of 10% to 20%; the electron blocking layer has a thickness of 10 angstroms to 20 angstroms; the p-AlGaN layer has a thickness of 100 angstroms to 500 angstroms, an Mg doping concentration of 1e19 to 5e19, and an Al component with respect to group III elements including Al of 20% to 40%; the HP layer has a thickness of 100 angstroms to 500 angstroms, an Mg doping concentration of 1e19 to 5e19, and an Al component with respect to group III elements including Al of 10% to 20%; the metal contact layer has a thickness between 10 angstroms and 50 angstroms and an Mg doping concentration of between 5e20 and 2e21. With the embodiments shown in the present application, the suitability of the LED epitaxial structure, under the component distribution ratio, can be ensured.

In some embodiments, the substrate layer comprises at least one of a silicon substrate, a SiC substrate, a GaN substrate, a sapphire substrate, an LSAT (lanthanum strontium aluminum tantalate) substrate, and a LiGaO$_2$ (lithium galliumate) substrate. With the embodiments shown herein, a variety of materials can be adopted to prepare the substrate layer.

In a second aspect, the present application discloses a preparation method for an LED epitaxial structure, characterized in that the method comprises: preparing a substrate layer; and epitaxially growing an u-GaN layer, an n-GaN layer, an n-type high-aluminium component AlGaN layer, an n-type AlGaN/GaN superlattice layer, an undoped GaN layer, an n-type high-doped AlGaN layer, an n-type low-doped AlGaN layer, a stress buffer layer, an electron blocking layer, a p-AlGaN layer, an HP layer, and a metal contact layer in sequence on the substrate layer; wherein the light-emitting layer comprises: a first multiple-quantum-well light-emitting layer and a second multiple-quantum-well light-emitting layer; the second multiple-quantum-well light-emitting layer is arranged immediately adjacent to the first multiple-quantum-well light-emitting layer, or the second multiple-quantum-well light-emitting layer is arranged in the middle of the first multiple-quantum-well light-emitting layer; wherein the first multiple-quantum-well light-emitting layer comprises a first shoe layer, a first well layer, a first cap layer, and a first Barrier layer epitaxially grown from bottom to top in sequence; wherein a thickness of the first shoe layer is provided to be 5 angstroms to 20 angstroms; a thickness of the first well layer is provided to be 25 angstroms to 40 angstroms and an In component with respect to group III elements including In is provided to be 0% to 3%; a thickness of the first cap layer is provided to be 5 angstroms to 20 angstroms; a thickness of the first Barrier layer is provided to be 50 angstroms to 150 angstroms, a Si doping concentration is provided to be 1e17-1e18, and an Al component with respect to group III elements including Al is provided to be 10% to 20%; the second multiple-quantum-well light-emitting layer comprises a second shoe layer, a second well layer, a second cap layer, and a second Barrier layer epitaxially grown from bottom to top in sequence; wherein a thickness of the second shoe layer is provided to be 5 angstroms to 20 angstroms; a thickness of the second well layer is provided to 25 angstroms to 40 angstroms and an In component with respect to group III elements including In is provided to be 4% to 6%; a thickness of the second cap layer is provided to be 5 angstroms to 20 angstroms; a thickness of the second Barrier layer is provided to be 50 angstroms to 150 angstroms, a Si doping concentration is provided to be 1e17 to 1e18, and an Al component with respect to group III elements including Al is provided to be 10% to 20%; the first multiple-quantum-well light-emitting layer is provided to grow for 4 to 8 cycle periods to a thickness of 500 angstroms to 1500 angstroms, and a single cycle period has a thickness of 100 angstroms to 180 angstroms, and it is prepared at a temperature of 800° C. to 950° C.; the second multiple-quantum-well light-emitting layer is provided to grow for 1 to 2 cycle periods to a thickness of 100 angstroms to 500 angstroms, and a single cycle period has a thickness of 100 angstroms to 180 angstroms, and it is prepared at a temperature of 800° C. to 950° C.; the first shoe layer is prepared at a temperature of 800° C. to 900° C.; the first well layer is prepared at a temperature of 800° C. to 900° C.; the first cap layer is prepared at a temperature of 800° C. to 900° C.; the first Barrier layer is prepared at a temperature of 850° C. to 950° C.; the second shoe layer is prepared at a temperature of 800° C. to 900° C.; the second well layer is prepared at a temperature of 800° C. to 900° C.; the second cap layer is prepared at a temperature of 800° C. to 900° C.; the second Barrier layer is prepared at a temperature of 850° C. to 950° C. With the preparation mode shown in the present application, the prepared epitaxial structure with the preparation method can be ensured, and the problem that the LED in the wave band of 365 nm to 375 nm would emit yellow light can be solved.

In a third aspect, the present application also provides the application of an LED epitaxial structure in the 365 nm to 375 nm wave band. The LED epitaxial structure is as described in any of the above embodiments.

In some embodiments, the light-emitting color of the LED epitaxial structure in the 365 nm to 375 nm wave band is purple.

In the above technical solutions, the present application discloses a novel structure design of a light-emitting layer, and discloses a matched epitaxial structure, which can effectively solve the problem that an existing LED with a light-emitting wavelength of 365 nm to 375 nm would emit yellow light; at the same time, the LED epitaxial structure disclosed in the present application can reduce the LED voltage and improve the anti-aging performance.

BRIEF DESCRIPTION OF THE DRAWINGS

In order to explain the technical solution of the embodiments of the present application more clearly, the following will briefly describe the accompanying drawings used in the embodiments. Obviously, for those of ordinary skills in the art, other drawings can be obtained from these drawings without involving inventive efforts.

DESCRIPTION OF THE EMBODIMENTS

In order to make the objects, embodiments, and advantages of the present application clearer, the exemplary embodiments of the present application will be described clearly and completely below with reference to the accompanying drawings in the exemplary embodiments of the present application. Obviously, the exemplary embodiments described are only a part of the embodiments of the present application, but not all of the embodiments.

Based on the exemplary embodiments described herein, all other embodiments obtained by a person of ordinary skill in the art without inventive effort are within the scope of the claims appended hereto. Moreover, while the disclosure herein has been described according to one or more exemplary embodiments, it should be understood that in terms of these aspects of the disclosure, they may individually constitute a complete embodiment. It should be noted that the brief description of terms in this application is merely for the convenience of understanding the embodiments described below and is not intended to limit the embodiments of the present application. Unless otherwise indicated, these terms should be understood according to their ordinary and customary meaning.

It should be understood that the terms "first", "second", "third", and the like in the description and in the claims of the present application, as well as in the above-described figures, are used for distinguishing between similar objects and not necessarily for describing a particular sequential or chronological order. It should be understood that the data so used are interchangeable under appropriate circumstances and that, for example, they can be implemented in sequences other than those illustrated or described according to the embodiments of the present application.

Figure 1:
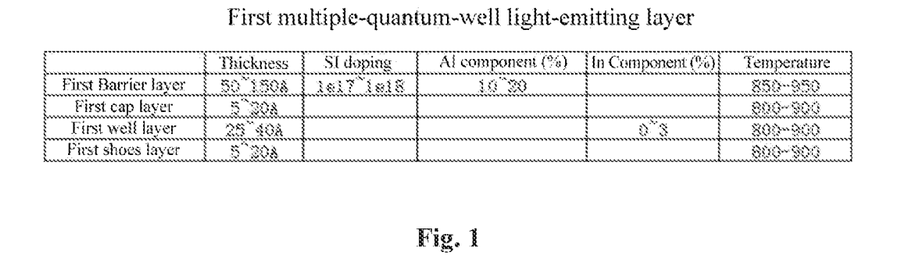
FIG. 1 illustrates a schematic view of a structure of a first multiple-quantum-well light-emitting layer according to some embodiments.
Figure 2:
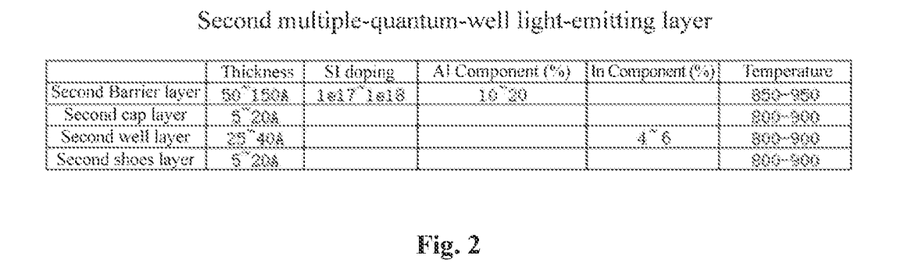
FIG. 2 illustrates a schematic view of a structure of a second multiple-quantum-well light-emitting layer according to some embodiments.

FIG. 1 is a schematic view showing a structure of a first multiple-quantum-well light-emitting layer according to an embodiment of the present application. FIG. 2 illustrates a schematic view of a structure of a second multiple-quantum-well light-emitting layer according to the present application. With reference to FIGS. 1 and 2, the present application provides an LED epitaxial structure, comprising: a light-emitting layer, which comprises: a first multiple-quantum-well light-emitting layer and a second multiple-quantum-well light-emitting layer; wherein the second multiple-quantum-well light-emitting layer is arranged immediately adjacent to the first multiple-quantum-well light-emitting layer, or the second multiple-quantum-well light-emitting layer is arranged in the middle of the first multiple-quantum-well light-emitting layer;

wherein the first multiple-quantum-well light-emitting layer comprises a first shoe layer, a first well layer, a first cap layer, and a first Barrier layer epitaxially grown from bottom to top in sequence; wherein the thickness of the first shoe layer is provided to be 5 angstroms to 20 angstroms; the thickness of the first well layer is provided to be 25 angstroms to 40 angstroms and an In component is provided to be 0% to 3%; the thickness of the first cap layer is provided to be 5 angstroms to 20 angstroms; the thickness of the first Barrier layer is provided to be 50 angstroms to 150 angstroms, a Si doping concentration is provided to be 1e17-1e18, and the Al component with respect to group III elements including Al is provided to be 10-20%;

the second multiple-quantum-well light-emitting layer comprises a second shoes layer, a second well layer, a second cap layer, and a second Barrier layer epitaxially grown from bottom to top in sequence; wherein the thickness of the second shoes layer is provided to be 5 angstroms to 20 angstroms; the thickness of the second well layer is provided to be 25 angstroms to 40 angstroms and the In component with respect to group III elements including In is provided to be 4% to 6%; the thickness of the second cap layer is provided to be 5 angstroms to 20 angstroms; the thickness of the second Barrier layer is provided to be 50 angstroms to 150 angstroms, the Si doping concentration is provided to be 1e17 to 1e18, and the Al component with respect to group III elements including Al is provided to be 10% to 20%.

Angstrom is a common unit of measure of the length of a light wave and the molecular diameter, with the symbol A.

It should be noted that the first shoe layer, the first well layer, the first cap layer, and the first Barrier layer are all customary naming manners in the art, and the light-emitting layer is a multiple-quantum-well (MOW) structure.

With the technical solution shown in the present embodiment and by making an appropriate composition ratio and an appropriate thickness setting of the light-emitting layer, the light emitted from the LED epitaxial structure using the light-emitting layer of the present application can be purple light rather than yellow light. At the same time, the InGaN containing high In component with respect to group III elements including In according to the present application can effectively reduce the series voltage of the LED and improve the anti-aging performance.

Figure 3:
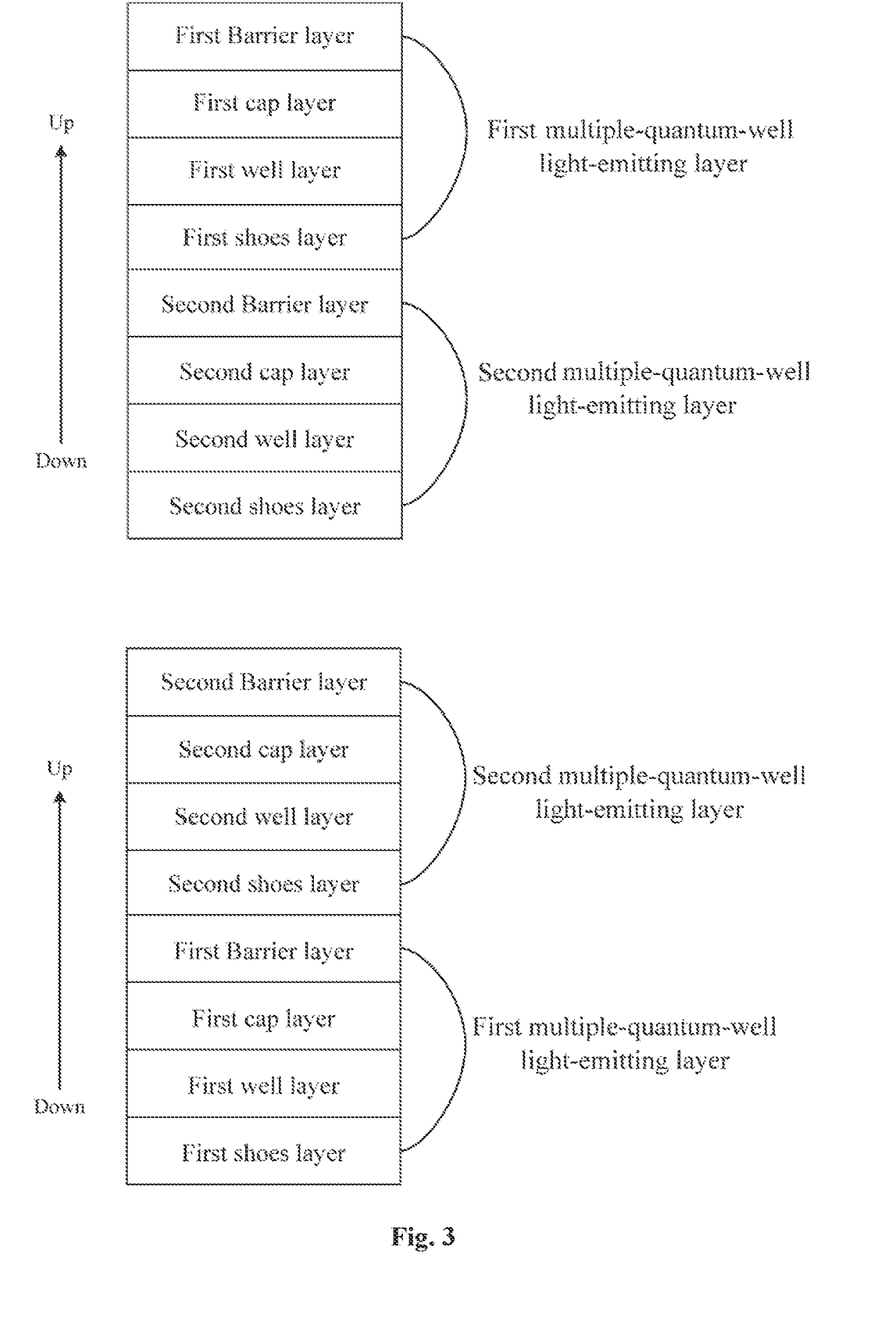
FIG. 3 illustrates a schematic view of a structure of a light-emitting layer according to some embodiments.

FIG. 3 is a schematic view showing a structure of a light-emitting layer according to an embodiment of the present application. In some embodiments, the second multiple-quantum-well light-emitting layer is arranged immediately adjacent to an upper surface of the first multiple-quantum-well light-emitting layer, or the second multiple-quantum-well light-emitting layer is arranged immediately adjacent to a lower surface of the first multiple-quantum-well light-emitting layer.

Figure 4:
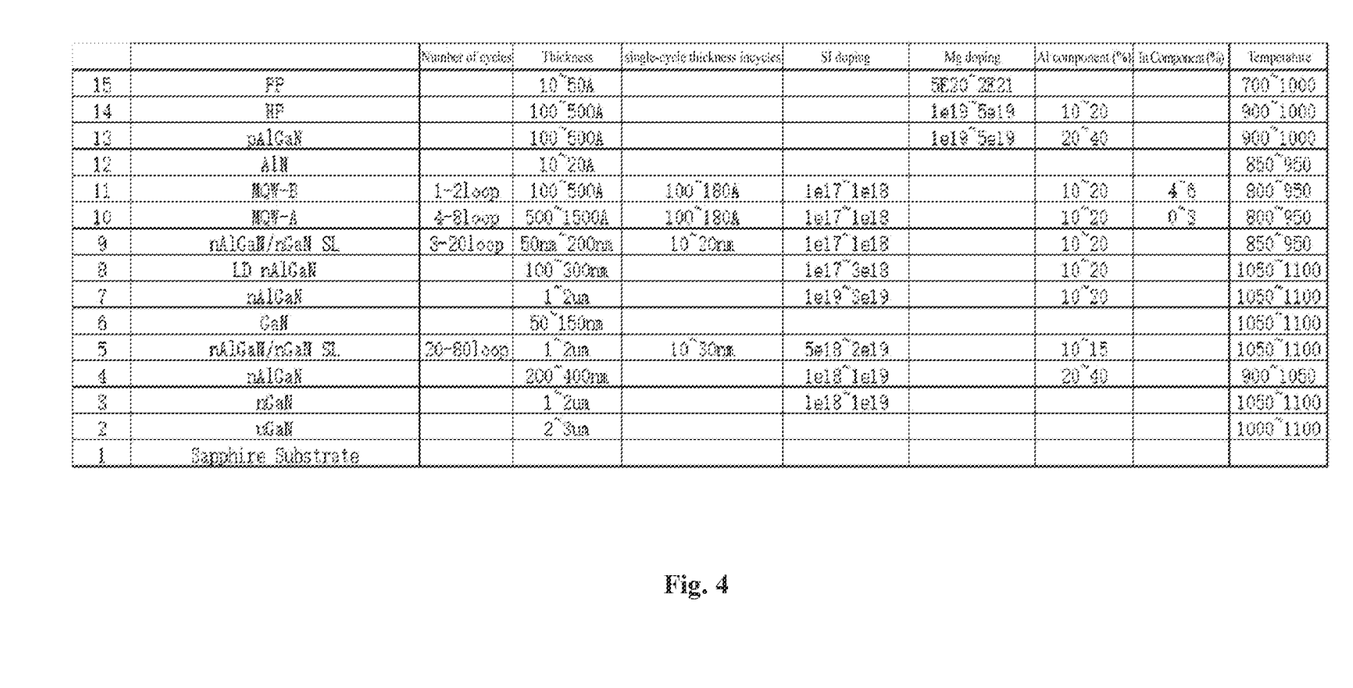
FIG. 4 illustrates a schematic view of an LED epitaxial structure and a preparation method thereof according to some embodiments.

FIG. 4 is a schematic view of an LED epitaxial structure and a preparation method thereof according to an embodiment of the present application.

As shown in FIG. 4, in some embodiments, the first multiple-quantum-well light-emitting layer has a thickness of 500 angstroms to 1500 angstroms, the Si doping concentration is 1e17 to 1e18, the Al component with respect to group III elements including Al is provided to 10% to 20%, and the In component with respect to group III elements including In is provided to be 0% to 3%; the thickness of the second multiple-quantum-well light-emitting layer is 100 angstroms to 500 angstroms, the Si doping concentration is 1e17 to 1e18, the Al component with respect to group III elements including Al is 10% to 20%, and the In component with respect to group III elements including In is 4% to 6%;

wherein the thickness of the first shoe layer is 5 angstroms to 20 angstroms; the first well layer has a thickness of 25 angstroms to 40 angstroms, and the In component with respect to group III elements including In is 0% to 3%; the thickness of the first cap layer is 5 angstroms to 20 angstroms; the first Barrier layer has a thickness of 50 angstroms to 150 angstroms, the Si doping concentration is 1e17 to 1e18, and the Al component with respect to group III elements including Al is 10% to 20%;

the thickness of the second shoe layer is 5 angstroms to 20 angstroms; the second well layer has a thickness of 25 angstroms to 40 angstroms, and the In component with respect to group III elements including In is 4% to 6%; the thickness of the second cap layer is 5 angstroms to 20 angstroms; the second Barrier layer has a thickness of 50 angstroms to 150 angstroms, the Si doping concentration is 1e17 to 1e18, and the Al component with respect to group III elements including Al is 10% to 20%.

In some embodiments, the LED epitaxial structure further comprises: a substrate layer, a u-GaN layer, an n-GaN layer, an n-type high-aluminium component AlGaN layer, an n-type AlGaN/GaN superlattice layer, an undoped GaN layer, an n-type high-doped AlGaN layer, an n-type low-doped AlGaN layer, a stress buffer layer, an electron blocking layer, a p-AlGaN layer, an HP layer, and a metal contact layer;

wherein the substrate layer, the u-GaN layer, the n-GaN layer, the n-type high-aluminium component AlGaN layer, the n-type AlGaN/GaN superlattice layer, the undoped GaN layer, the n-type high-doped AlGaN layer, the n-type low-doped AlGaN layer, the stress buffer layer, the light-emitting layer, the electron blocking layer, the p-AlGaN layer, the HP layer, and the metal contact layer are LED epitaxial structures which are successively and epitaxially grown from bottom to top starting from the substrate layer.

It needs to be noted that, the substrate layer in FIG. 4 is the Sapphire Substrate layer shown in the first layer in FIG. 4, the n-type high-aluminium component AlGaN layer is the nAlGaN layer shown in the fourth layer in FIG. 4, the n-type AlGaN/GaN superlattice layer is the nAlGaN/nGaN SL layer shown in the fifth layer in FIG. 4, the undoped GaN layer is the GaN layer shown in the sixth layer in FIG. 4, the n-type high-doped AlGaN layer is the nAlGaN layer shown in the seventh layer in FIG. 4, the n-type low-doped AlGaN layer is an LD nAlGaN layer shown in the eighth layer of FIG. 4, the stress buffer layer is an nAlGaN/nGaN SL layer as shown in the ninth layer of FIG. 4, the light-emitting layer is an MQW-A layer and an MQW-B layer as shown in the tenth layer and the eleventh layer of FIG. 4, the MQW-A layer is the first multiple-quantum-well light-emitting layer, the MQW-B layer is the second multiple-quantum-well light-emitting layer, the electron blocking layer is an AlN layer as shown in the twelfth layer of FIG. 4, and the metal contact layer is a PP layer as shown in FIG. 4.

In some embodiments, the u-GaN layer has a thickness of 2 to 3 microns;

The n-GaN layer has a thickness of 1 micron to 2 microns and the Si doping concentration is 1e18 to 1e19;

the n-type high-aluminium component AlGaN layer has a thickness of 200 microns to 400 microns, the Si doping concentration is 1e18 to 1e19, and the Al component with respect to group III elements including Al is 20% to 40%;

the n-type AlGaN/GaN superlattice layer has a thickness of 1 micron to 2 microns, the Si doping concentration is 5e18 to 1e19, and the Al component with respect to group III elements including Al is 10% to 15%;

the undoped GaN layer has a thickness of 50 nm to 150 nm;

the n-type high-doped AlGaN layer has a thickness of 1 micron to 2 microns, the Si doping concentration is 1e19 to 3e19, and the Al component with respect to group III elements including Al is 10% to 20%;

the n-type low-doped AlGaN layer has a thickness of 100 nm to 300 nm, the Si doping concentration is 1e17 to 3e18, and the Al component with respect to group III elements including Al is 10% to 20%;

the stress buffer layer has a thickness of 50 nm to 200 nm, the Si doping concentration is 1e17 to 1e18, and the Al component with respect to group III elements including Al is 10% to 20%;

the electron blocking layer has a thickness of 10 angstroms to 20 angstroms;

the p-AlGaN layer has a thickness of 100 angstroms to 500 angstroms, the Mg doping concentration is 1e09 to 5e19, and the Al component with respect to group III elements including Al is 20% to 40%;

the HP layer has a thickness of 100 angstroms to 500 angstroms, the Mg doping concentration is 1e19 to 5e19, and the Al component with respect to group III elements including Al is 10% to 20%;

the metal contact layer has a thickness between 10 angstroms and 50 angstroms and the Mg doping concentration is between 5e20 and 2e21.

In some embodiments, the substrate layer comprises at least one of the silicon substrate, SiC substrate, GaN substrate, a sapphire substrate, LSAT (lanthanum strontium aluminum tantalate) substrate, and LiGaO$_2$ (lithium galliumate) substrate.

The present application also discloses a preparation method for an LED epitaxial structure, characterized in that the method comprises:

preparing a substrate layer; and epitaxially growing a u-GaN layer, an n-GaN layer, an n-type high-aluminium component AlGaN layer, an n-type AlGaN/GaN superlattice layer, an undoped GaN layer, an n-type high-doped AlGaN layer, an n-type low-doped AlGaN layer, a stress buffer layer, an electron blocking layer, a p-AlGaN layer, an HP layer, and a metal contact layer in sequence on the substrate layer;

wherein the light-emitting layer comprises: a first multiple-quantum-well light-emitting layer and a second multiple-quantum-well light-emitting layer; the second multiple-quantum-well light-emitting layer is arranged immediately adjacent to the first multiple-quantum-well light-emitting layer, or the second multiple-quantum-well light-emitting layer is arranged in the middle of the first multiple-quantum-well light-emitting layer;

wherein the first multiple-quantum-well light-emitting layer comprises a first shoe layer, a first well layer, a first cap layer, and a first Barrier layer epitaxially grown from bottom to top in sequence; wherein the thickness of the first shoe layer is provided to be 5 angstroms to 20 angstroms; the thickness of the first well layer is provided to be 25 angstroms to 40 angstroms and the In component with respect to group Ill elements including In is provided to be 0% to 3%; the thickness of the first cap layer is provided to be 5 angstroms to 20 angstroms; the thickness of the first Barrier layer is provided to be 50 angstroms to 150 angstroms, the Si doping concentration is provided to be 1e17-1e18, and the Al component with respect to group III elements including Al is provided to be 10-20%;

the second multiple-quantum-well light-emitting layer comprises a second shoe layer, a second well layer, a second cap layer, and a second Barrier layer epitaxially grown from bottom to top in sequence; wherein the thickness of the second shoe layer is provided to be 5 angstroms to 20 angstroms; the thickness of the second well layer is provided to 25 angstroms to 40 angstroms and the In component with respect to group Ill elements including In is provided to be 4% to 6%; the thickness of the second cap layer is provided to be 5 angstroms to 20 angstroms; the thickness of the second Barrier layer is provided to be 50 angstroms to 150 angstroms, the Si doping concentration is provided to be 1e17 to 1e18, and the Al component with respect to group III elements including Al is provided to be 10% to 20%;

the first multiple-quantum-well light-emitting layer is provided to grow for 4 to 8 cycle periods to a thickness of 500 angstroms to 1500 angstroms, and a single cycle period has a thickness of 100 angstroms to 180 angstroms, and it is prepared at a temperature of 800° C. to 950° C.;

the second multiple-quantum-well light-emitting layer is provided to grow for 1 to 2 cycle periods to a thickness of 100 angstroms to 500 angstroms, and a single cycle period has a thickness of 100 angstroms to 180 angstroms, and it is prepared at a temperature of 800° C. to 950° C.;

the first shoe layer is prepared at a temperature of 800° C. to 900° C.; the first well layer is prepared at a temperature of 800° C. to 900° C.; the first cap layer is prepared at a temperature of 800° C. to 900° C.; the first Barrier layer is prepared at a temperature of 850° C. to 950° C.;

the second shoe layer is prepared at a temperature of 800° C. to 900° C. the second well layer is prepared at a temperature of 800° C. to 900° C.; the second cap layer is prepared at a temperature of 800° C. to 900° C.; the second Barrier layer is prepared at a temperature of 850° C. to 950° C.

In some embodiments, the u-GaN layer is provided to have a thickness of 2 microns to 3 microns, and is prepared at a temperature of 1000° C. to 1100° C.;

the n-GaN layer is provided to have a thickness of 1 micron to 2 microns, the Si doping concentration of 1e18 to 1e19, and is prepared at a temperature of 1050° C. to 1100° C.;

the n-type high-aluminium component AlGaN layer is provided to have a thickness of 200 microns to 400 microns, a Si doping concentration of 118 to 1e19, and an Al component of 20% to 40%, and is prepared at a temperature of 900° C. to 1050° C.;

the n-type AlGaN/GaN superlattice layer is provided to grow for 20 to 80 cycle periods and have a thickness of 1 micron to 2 microns, the thickness of a single cycle period being 10 nm to 30 nm, the Si doping concentration of 5e18 to 1e19, the Al component with respect to group III elements including Al of 10% to 15%, and is prepared at a temperature of 1050° C. to 1100° C.;

the undoped GaN layer is provided to have a thickness of 50 nm to 150 nm and is prepared at a temperature of 1050° C. to 1100° C.;

the n-type high-doped AlGaN layer is provided to have a thickness of 1 micron to 2 microns, the Si doping concentration of 1e19 to 3e19, the Al component with respect to group III elements including Al of 10% to 20%, and is prepared at a temperature of 1050° C. to 1100° C.;

the n-type low-doped AlGaN layer is provided to have a thickness of 100 nm to 300 nm, a Si doping concentration of 1e17 to 3e18, and an Al component with respect to group III elements including Al of 10% to 20%, and is prepared at a temperature of 1050° C. to 1100° C.;

the stress buffer layer is provided to grow for 3 to 20 cycles and have a thickness of 50 nm to 200 nm, the thickness of a single cycle period being 10 nm to 20 nm, the Si doping concentration of 1e17 to 1e18, the Al component with respect to group III elements including Al of 10% to 20%, and is prepared at a temperature of 850° C. to 950° C.;

the electron blocking layer is provided to have a thickness of 10 angstroms to 20 angstroms and is prepared at a temperature of 850° C. to 950° C.;

the p-AlGaN layer is provided to have a thickness of 100 angstroms to 500 angstroms, the Mg doping concentration of 1e19 to 5e19, the Al component with respect to group III elements including Al of 20% to 40%, and is prepared at a temperature of 900° C. to 1000° C.;

the HP layer is provided to have a thickness of 100 angstroms to 500 angstroms, the Mg doping concentration of 1e19 to 5e19, the Al component with respect to group III elements including Al of 10% to 20%, and is prepared at a temperature of 900° C. to 1000° C.;

the metal contact layer is provided to have a thickness of 10 angstroms to 50 angstroms, the Mg doping concentration of 5e20 to 2e21, and is prepared at a temperature of 700° C. to 1000° C.

In another aspect, the present application also provides the application of an LED epitaxial structure in the 365 nm to 375 nm wave band. The LED epitaxial structure is provided according to any of the above embodiments.

In some embodiments, the light-emitting color of the LED epitaxial structure in the 365 nm to 375 nm wave band is purple.

It should be understood that a specific embodiment of the above-described application of an LED epitaxial structure in the 365 nm to 375 nm wave band can be seen in the previous embodiments and will not be described in detail herein. It can be seen from the above-mentioned embodiments that the LED epitaxial structure and the application of the LED epitaxial structure in the wave band of 365 nm to 375 nm disclosed in the present application can effectively solve the problem that the existing LED with a light-emitting wavelength of 365 nm to 375 nm emits yellow light. At the same time, the LED epitaxial structure disclosed in this application can reduce the LED voltage and improve the anti-aging performance.

Finally, it should be noted that: the above examples are merely illustrative of the technical solutions of the present application and are not intended to be limiting thereof; although the present application has been described in detail with reference to the foregoing examples, those skilled in the art will appreciate that: the technical solutions recited concerning the above examples can still be modified, or some or all of the technical features thereof can be equivalently replaced; such modifications or substitutions do not depart the nature of the corresponding technical solutions from the scope of the various examples and technical solutions of the present application.

The foregoing description, for purposes of explanation, has been presented in connection with specific embodiments. However, the above exemplary discussion is not intended to be exhaustive or to limit the embodiments to the precise forms as disclosed above. Many modifications and variations are possible in light of the above teaching. The embodiments are chosen and described in order to better explain the principles and practical applications, thereby enabling those skilled in the art to better utilize the embodiments and contemplate various modifications of the embodiment for particular use.

What is claimed is:

1. An LED epitaxial structure, comprising a light-emitting layer,
   wherein the light-emitting layer comprises a first multiple-quantum-well light-emitting layer and a second multiple-quantum-well light-emitting layer; wherein the second multiple-quantum-well light-emitting layer is arranged immediately adjacent to the first multiple-quantum-well light-emitting layer, or the second multiple-quantum-well light-emitting layer is arranged in a middle of the first multiple-quantum-well light-emitting layer;
   wherein the first multiple-quantum-well light-emitting layer comprises a first shoe layer, a first well layer, a first cap layer, and a first Barrier layer epitaxially grown from bottom to top in sequence; wherein a thickness of the first shoe layer is provided to be 5 angstroms to 20 angstroms; a thickness of the first well layer is provided to be 25 angstroms to 40 angstroms and an In component with respect to group III elements including In is provided to be 0% to 3%; a thickness of the first cap layer is provided to be 5 angstroms to 20 angstroms; a thickness of the first Barrier layer is provided to be 50 angstroms to 150 angstroms, a Si doping concentration is provided to be 1e17-1e18, and an Al component with respect to group III elements including Al is provided to be 10-20%;
   wherein the second multiple-quantum-well light-emitting layer comprises a second shoe layer, a second well layer, a second cap layer, and a second Barrier layer epitaxially grown from bottom to top in sequence; wherein a thickness of the second shoe layer is provided to be 5 angstroms to 20 angstroms; a thickness of the second well layer is provided to 25 angstroms to 40 angstroms and an In component with respect to group III elements including In is provided to be 4% to 6%; a thickness of the second cap layer is provided to be 5 angstroms to 20 angstroms; a thickness of the second Barrier layer is provided to be 50 angstroms to 150 angstroms, a Si doping concentration is provided to be 1e17 to 1e18, and an Al component respect to group III elements including Al is provided to be 10% to 20%,
   wherein the LED epitaxial structure further comprises: a substrate layer, a u-GaN layer, an n-GaN layer, an n-type high-aluminium component AlGaN layer, an n-type AlGaN/GaN superlattice layer, an undoped GaN layer, an n-type high-doped AlGaN layer, an n-type low-doped AlGaN layer, a stress buffer layer, an electron blocking layer, a p-AlGaN layer, an HP layer, and a metal contact layer;
   wherein the substrate layer, the u-GaN layer, the n-GaN layer, the n-type high-aluminium component AlGaN layer, the n-type AlGaN/GaN superlattice layer, the undoped GaN layer, the n-type high-doped AlGaN layer, the n-type low-doped AlGaN layer, the stress buffer layer, the light-emitting layer, the electron blocking layer, the p-AlGaN layer, the HP layer, and the metal contact layer form the LED epitaxial structure which is successively and epitaxially grown from bottom to top starting from the substrate layer.

2. The LED epitaxial structure of claim 1, wherein the second multiple-quantum-well light-emitting layer is arranged immediately adjacent to an upper surface of the first multiple-quantum-well light-emitting layer, or the second multiple-quantum-well light-emitting layer is arranged immediately adjacent to a lower surface of the first multiple-quantum-well light-emitting layer.

3. The LED epitaxial structure of claim 2, wherein the first multiple-quantum-well light-emitting layer has a thickness of 500 angstroms to 1500 angstroms, the Si doping concentration is 1e17 to 1e18, the Al component with respect to group III elements including Al is 10% to 20%, and the In component with respect to group III elements including In is 0% to 3%; the thickness of the second multiple-quantum-well light-emitting layer is 100 angstroms to 500 angstroms, the Si doping concentration is 1e17 to 1e18, the Al component with respect to group III elements including Al is 10% to 20%, and the In component with respect to group III elements including In is 4% to 6%.

4. The LED epitaxial structure of claim 1, wherein the u-GaN layer has a thickness of 2 microns to 3 microns;
   the n-GaN layer has a thickness of 1 micron to 2 microns and a Si doping concentration of 1e18 to 1e19;
   the n-type high-aluminium component AlGaN layer has a thickness of 200 microns to 400 microns, a Si doping concentration of 1e18 to 1e19, and an Al component with respect to group III elements including Al of 20% to 40%;
   the n-type AlGaN/GaN superlattice layer has a thickness of 1 micron to 2 microns, a Si doping concentration of 5e18 to 1e19, and an Al component with respect to group III elements including Al of 10% to 15%;
   the undoped GaN layer has a thickness of 50 nm to 150 nm;
   the n-type high-doped AlGaN layer has a thickness of 1 micron to 2 microns, a Si doping concentration of 1e19 to 3e19, and an Al component with respect to group III elements including Al of 10% to 20%;
   the n-type low-doped AlGaN layer has a thickness of 100 nm to 300 nm, a Si doping concentration of 1e17 to 3e18, and an Al component of 10% to 20%;
   the stress buffer layer has a thickness of 50 nm to 200 nm, a Si doping concentration of 1e17 to 1e18, and an Al component with respect to group III elements including Al of 10% to 20%;
   the electron blocking layer has a thickness of 10 angstroms to 20 angstroms;
   the p-AlGaN layer has a thickness of 100 angstroms to 500 angstroms, an Mg doping concentration of 1e19 to 5e19, and an Al component with respect to group III elements including Al of 20% to 40%;
   the HP layer has a thickness of 100 angstroms to 500 angstroms, an Mg doping concentration of 1e19 to 5e19, and an Al component with respect to group III elements including Al of 10% to 20%;
   the metal contact layer has a thickness between 10 angstroms and 50 angstroms and an Mg doping concentration of between 5e20 and 2e21.

5. The LED epitaxial structure of claim 4, characterized in that the substrate layer comprises: at least one of a silicon substrate, a SiC substrate, a GaN substrate, a sapphire substrate, an LSAT substrate, and a LiGaO$_2$ substrate.

6. A method for preparing an LED epitaxial structure, comprising:
preparing a substrate layer; and
epitaxially growing a u-GaN layer, an n-GaN layer, an n-type high-aluminium component AlGaN layer, an n-type AlGaN/GaN superlattice layer, an undoped GaN layer, an n-type high-doped AlGaN layer, an n-type low-doped AlGaN layer, a stress buffer layer, a light-emitting layer, an electron blocking layer, a p-AlGaN layer, an HP layer, and a metal contact layer in sequence on the substrate layer;
wherein the light-emitting layer comprises a first multiple-quantum-well light-emitting layer and a second multiple-quantum-well light-emitting layer; wherein the second multiple-quantum-well light-emitting layer is arranged immediately adjacent to the first multiple-quantum-well light-emitting layer, or the second multiple-quantum-well light-emitting layer is arranged in a middle of the first multiple-quantum-well light-emitting layer;
wherein the first multiple-quantum-well light-emitting layer comprises a first shoe layer, a first well layer, a first cap layer, and a first Barrier layer epitaxially grown from bottom to top in sequence; wherein a thickness of the first shoe layer is provided to be 5 angstroms to 20 angstroms; a thickness of the first well layer is provided to be 25 angstroms to 40 angstroms and an In component with respect to group III elements including In is provided to be 0% to 3%; a thickness of the first cap layer is provided to be 5 angstroms to 20 angstroms; a thickness of the first Barrier layer is provided to be 50 angstroms to 150 angstroms, a Si doping concentration is provided to be 1e17-1e18, and an Al component with respect to group III elements including Al is provided to be 10-20%;
wherein the second multiple-quantum-well light-emitting layer comprises a second shoe layer, a second well layer, a second cap layer, and a second Barrier layer epitaxially grown from bottom to top in sequence; wherein a thickness of the second shoe layer is provided to be 5 angstroms to 20 angstroms; a thickness of the second well layer is provided to 25 angstroms to 40 angstroms and an In component with respect to group III elements including In is provided to be 4% to 6%; a thickness of the second cap layer is provided to be 5 angstroms to 20 angstroms; a thickness of the second Barrier layer is provided to be 50 angstroms to 150 angstroms, a Si doping concentration is provided to be 1e17 to 1e18, and an Al component with respect to group III elements including Al is provided to be 10% to 20%;
wherein the first multiple-quantum-well light-emitting layer is provided to grow for 4 to 8 cycle periods to a thickness of 500 angstroms to 1500 angstroms, and a single cycle period has a thickness of 100 angstroms to 180 angstroms, and it is prepared at a temperature of 800° C. to 950° C.;
wherein the second multiple-quantum-well light-emitting layer is provided to grow for 1 to 2 cycle periods to a thickness of 100 angstroms to 500 angstroms, and a single cycle period has a thickness of 100 angstroms to 180 angstroms, and it is prepared at a temperature of 800° C. to 950° C.;
wherein the first shoe layer is prepared at a temperature of 800° C. to 900° C.; the first well layer is prepared at a temperature of 800° C. to 900° C.; the first cap layer is prepared at a temperature of 800° C. to 900° C.; the first Barrier layer is prepared at a temperature of 850° C. to 950° C.;
wherein the second shoe layer is prepared at a temperature of 800° C. to 900° C.; the second well layer is prepared at a temperature of 800° C. to 900° C.; the second cap layer is prepared at a temperature of 800° C. to 900° C.; the second Barrier layer is prepared at a temperature of 850° C. to 950° C.

7. The method for preparing an LED epitaxial structure according to claim 6, further comprising:
the u-GaN layer is provided to have a thickness of 2 microns to 3 microns, and is prepared at a temperature of 1000° C. to 1100° C.;
the n-GaN layer is provided to have a thickness of 1 micron to 2 microns and a Si doping concentration of 1e18 to 1e19, and is prepared at a temperature of 1050° C. to 1100° C.;
the n-type high-aluminium component AlGaN layer is provided to have a thickness of 200 microns to 400 microns, a Si doping concentration of 1e18 to 1e19, and an Al component of 20% to 40%, and is prepared at a temperature of 900° C. to 1050° C.;
the n-type AlGaN/GaN superlattice layer is provided to grow for 20 to 80 cycle periods and have a thickness of 1 micron to 2 microns, a thickness of a single cycle period being 10 nm to 30 nm, a Si doping concentration of 5e18 to 1e19, an Al component with respect to group III elements including Al of 10% to 15%, and is prepared at a temperature of 1050° C. to 1100° C.;
the undoped GaN layer is provided to have a thickness of 50 nm to 150 nm and is prepared at a temperature of 1050° C. to 1100° C.;
the n-type high-doped AlGaN layer is provided to have a thickness of 1 micron to 2 microns, a Si doping concentration of 1e19 to 3e19, and an Al component with respect to group III elements including Al of 10% to 20%, and is prepared at a temperature of 1050° C. to 1100° C.;
the n-type low-doped AlGaN layer is provided to have a thickness of 100 nm to 300 nm, a Si doping concentration of 1e17 to 3e18, and an Al component with respect to group III elements including Al of 10% to 20%, and is prepared at a temperature of 1050° C. to 1100° C.;
the stress buffer layer is provided to grow for 3 to 20 cycles and have a thickness of 50 nm to 200 nm, a thickness of a single cycle period being 10 nm to 20 nm, a Si doping concentration of 1e17 to 1e18, an Al component with respect to group III elements including Al of 10% to 20%, and is prepared at a temperature of 850° C. to 950° C.;
the electron blocking layer is provided to have a thickness of 10 angstroms to 20 angstroms and is prepared at a temperature of 850° C. to 950° C.;
the p-AlGaN layer is provided to have a thickness of 100 angstroms to 500 angstroms, an Mg doping concentration of 1e19 to 5e19, and an Al component of 20% to 40%, and is prepared at a temperature of 900° C. to 1000° C.;
the HP layer is provided to have a thickness of 100 angstroms to 500 angstroms, an Mg doping concentration of 1e19 to 5e19, and an Al component with respect to group III elements including Al of 10% to 20%, and is prepared at a temperature of 900° C. to 1000° C.;

the metal contact layer is provided to have a thickness of 10 angstroms to 50 angstroms, an Mg doping concentration of 5e20 to 2e21, and is prepared at a temperature of 700° C. to 1000° C.

8. An application of an LED epitaxial structure according to claim 1 in a wave band of 365 nm to 375 nm.

9. The application according to claim 8, wherein a light-emitting color of the LED epitaxial structure in the wave band of 365 nm to 375 nm is purple.

* * * * *